United States Patent
Hessenius et al.

(10) Patent No.: US 12,379,431 B2
(45) Date of Patent: Aug. 5, 2025

(54) MAGNETOMETER DEVICE

(71) Applicant: DeUVe Photonics, Inc., Sahuarita, AZ (US)

(72) Inventors: Chris Hessenius, Sahuarita, AZ (US); Mahmoud Fallahi, Sahuarita, AZ (US)

(73) Assignee: DEUVE PHOTONICS, INC., Tucson, AZ (US)

( * ) Notice: Subject to any disclaimer, the term of this patent is extended or adjusted under 35 U.S.C. 154(b) by 222 days.

(21) Appl. No.: 18/347,283

(22) Filed: Jul. 5, 2023

(65) Prior Publication Data

US 2024/0012071 A1 Jan. 11, 2024

Related U.S. Application Data

(60) Provisional application No. 63/358,441, filed on Jul. 5, 2022.

(51) Int. Cl.
*G01R 33/032* (2006.01)

(52) U.S. Cl.
CPC .................. *G01R 33/032* (2013.01)

(58) Field of Classification Search
CPC ..................................... G01R 33/032
USPC ........................................ 324/244.1
See application file for complete search history.

(56) References Cited

U.S. PATENT DOCUMENTS

| 5,119,024 A | 6/1992 | Popovic et al. |
| 7,723,985 B2 | 5/2010 | Smith |
| 8,422,119 B1 | 4/2013 | Keaton et al. |
| 9,568,565 B2 | 2/2017 | Parsa et al. |
| 9,684,041 B2 | 6/2017 | Nagasak et al. |
| 2004/0252734 A1 | 12/2004 | Karpushko |
| 2008/0019406 A1 | 1/2008 | Abram et al. |
| 2009/0296752 A1 | 12/2009 | Giaretta et al. |
| 2011/0175604 A1 | 7/2011 | Polzer et al. |
| 2013/0021602 A1 | 1/2013 | Dribinski et al. |

(Continued)

FOREIGN PATENT DOCUMENTS

WO    2004064211 A1    7/2004

OTHER PUBLICATIONS

WIPO, "International Search Report and Written Opinion" issued in connection with WIPO Patent Application PCT/US2024/036793, dated Nov. 15, 2024, 11 pages.

(Continued)

*Primary Examiner* — Christopher P McAndrew
(74) *Attorney, Agent, or Firm* — NGUYEN TARBET IP LAW

(57) ABSTRACT

A magnetometer device structured to measure a magnetic field while minimizing an effect of vibration on output. The device may comprise a laser cavity network containing a plurality of spatially-distinct cavity arms, each comprising a gain chip configured to generate a laser beam towards one or more optical elements disposed optically in line with the laser beam, configured to direct the laser beam towards a nitrogen vacancy (NV) diamond. The device may further comprise the NV diamond, configured to accept a plurality of laser beams of the plurality of cavity arms without a common output coupler, preventing the plurality of laser beams from spatially overlapping, and measure the magnetic field in response to the plurality of laser beams. The device may further comprise a reflective element for reflecting each laser beam back into each cavity arm.

16 Claims, 6 Drawing Sheets

(56) References Cited

U.S. PATENT DOCUMENTS

| | | | |
|---|---|---|---|
| 2015/0071316 A1 | 3/2015 | Chuang | |
| 2015/0311673 A1 | 10/2015 | Wang et al. | |
| 2017/0212177 A1 | 7/2017 | Coar et al. | |
| 2017/0212180 A1 | 7/2017 | Hahn et al. | |
| 2017/0212186 A1 | 7/2017 | Hahn et al. | |
| 2018/0337516 A1 | 11/2018 | Tatum et al. | |
| 2019/0312408 A1 | 10/2019 | Fallahi et al. | |
| 2020/0158798 A1* | 5/2020 | Huck | G01R 33/032 |
| 2022/0197225 A1* | 6/2022 | Trusheim | H03L 7/26 |
| 2023/0266415 A1* | 8/2023 | Brenneis | G01R 33/26 |
| | | | 324/304 |

OTHER PUBLICATIONS

Shin, David. Nonlocal correlations between freely propagating pairs of atoms. Diss. The Australian National University (Australia), 2022.
Steinert et al. "High sensitivity magnetic imaging using an array of spins in diamond." Review of scientific instruments 81.4 (2010).
Hannegan II, John Michael. Experiments with Frequency Converted Photons from a Trapped Atomic Ion. Diss. University of Maryland, College Park, 2022.

* cited by examiner

MAGNETOMETER DEVICE

CROSS-REFERENCES TO RELATED APPLICATIONS

This application is a non-provisional and claims benefit of U.S. Provisional Application No. 63/358,441 filed Jul. 5, 2022, the specification of which is incorporated herein in its entirety by reference.

FIELD OF THE INVENTION

The present invention is directed to magnetometer devices configured to efficiently and accurately measure a magnetic field.

BACKGROUND OF THE INVENTION

A magnetometer is a device used to measure the magnetic field, particularly with respect to its magnetic strength and orientation. Magnetometers, due to the many ways that magnetic fields appear in the world, are used for a variety of purposes. These include locating objects giving off a magnetic field or that are susceptible to magnetism, especially in hazardous locations, heart monitoring, positioning for drills and military weapons systems, weather prediction, plate tectonics, radio wave propagation, and planetary exploration. Additionally, magnetometers can be used for air transportation navigation, such as in spacecraft, airplanes, helicopters, etc.

However, magnetometers are susceptible to a plurality of factors that can interfere with accuracy, especially in applications where the magnetic field of the Earth is being measured due to the subtlety of the signal. Examples of these interfering factors include noise from other magnetic fields or electronics, solar winds/magnetic storms, and vibration. Prior magnetometers, especially those used for air transportation, can be thrown off by these factors and generate inaccurate outputs as a result. Thus, there exists a present need for a magnetometer device tuned to account for interfering factors to efficiently provide accurate measurement of a magnetic field.

BRIEF SUMMARY OF THE INVENTION

It is an objective of the present invention to provide devices that allow for efficient and accurate measurement of a magnetic field, as specified in the independent claims. Embodiments of the invention are given in the dependent claims. Embodiments of the present invention can be freely combined with each other if they are not mutually exclusive.

The present invention features a magnetometer device structured to measure a magnetic field while minimizing the effect of vibration on output. The device may comprise a laser cavity network containing a plurality of spatially-distinct cavity arms. Each cavity arm may comprise a gain chip configured to generate a laser beam toward one or more optical elements. Each cavity arm may further comprise the one or more optical elements disposed optically in line with the laser beam, configured to direct the laser beam towards a nitrogen-vacancy (NV) diamond. Each cavity may further comprise a mirror disposed optically in line with the laser beam directed towards the NV diamond, configured to be transparent to the laser beam and reflective to laser beams generated by gain chips of other cavity arms of the plurality of cavity arms. The device may further comprise the NV diamond disposed within the laser cavity network, configured to accept a plurality of laser beams of the plurality of cavity arms without a common output coupler and measure the magnetic field in response to the plurality of laser beams. The laser beams may be prevented from spatially overlapping.

The present invention features a magnetometer device structured to measure a magnetic field while minimizing the effect of vibration on output. The device may comprise a laser cavity network containing a plurality of spatially-distinct cavity arms. Each cavity arm may comprise a gain chip configured to generate a laser beam toward one or more optical elements. Each cavity arm may further comprise the one or more optical elements disposed optically in line with the laser beam, configured to direct the laser beam towards a NV diamond. Each laser beam of a plurality of laser beams of the plurality of cavity arms may comprise a different size. The device may further comprise the NV diamond disposed within the laser cavity network, configured to accept the plurality of laser beams of the plurality of cavity arms without a common output coupler and measure the magnetic field in response to the plurality of laser beams. As a result of the differing sizes of the plurality of laser beams, the plurality of laser beams may spatially overlap without reacting to vibrations.

The main advantage of the present invention is the implementation of overlapping portions to two or more laser cavities, but there is no common output coupler. That allows the present invention to have independent control of wavelength, linewidth, transverse mode profile, beam size, and beam position for each cavity. Since prior systems used a common output coupler for the two or more laser cavities, complete freedom of each cavity's beam position and size was impossible. This is a critical difference as it allows for a magnetometer device with more vibration resistance.

One of the unique and inventive technical features of the present invention is the implementation of two separate cavities for laser propagation with no shared optical surfaces. Without wishing to limit the invention to any theory or mechanism, it is believed that the technical feature of the present invention advantageously provides for the minimization of the effect of vibration and noise on the output of the magnetometer device. None of the presently known prior references or work has the unique inventive technical feature of the present invention.

Furthermore, the inventive technical features of the present invention contributed to a surprising result. One skilled in the art would not expect a magnetometer to be able to account for this noise and vibration, because of the amount of tuning of the laser components necessary to allow the magnetometer to work properly while accounting for noise and vibration. The present invention implements two separate cavities for laser propagation with no shared optical surfaces, allowing for two different laser beams to be tuned differently to account for the said noise and vibration without one laser's vibration affecting the other. Surprisingly, this allows for the minimization of the effect of vibration and noise on the output of the magnetometer device. Thus, the inventive technical feature of the present invention contributed to a surprising result.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE SEVERAL VIEWS OF THE DRAWING(S)

The features and advantages of the present invention will become apparent from a consideration of the following detailed description presented in connection with the accompanying drawings in which.

DETAILED DESCRIPTION OF THE INVENTION

Figure 2:
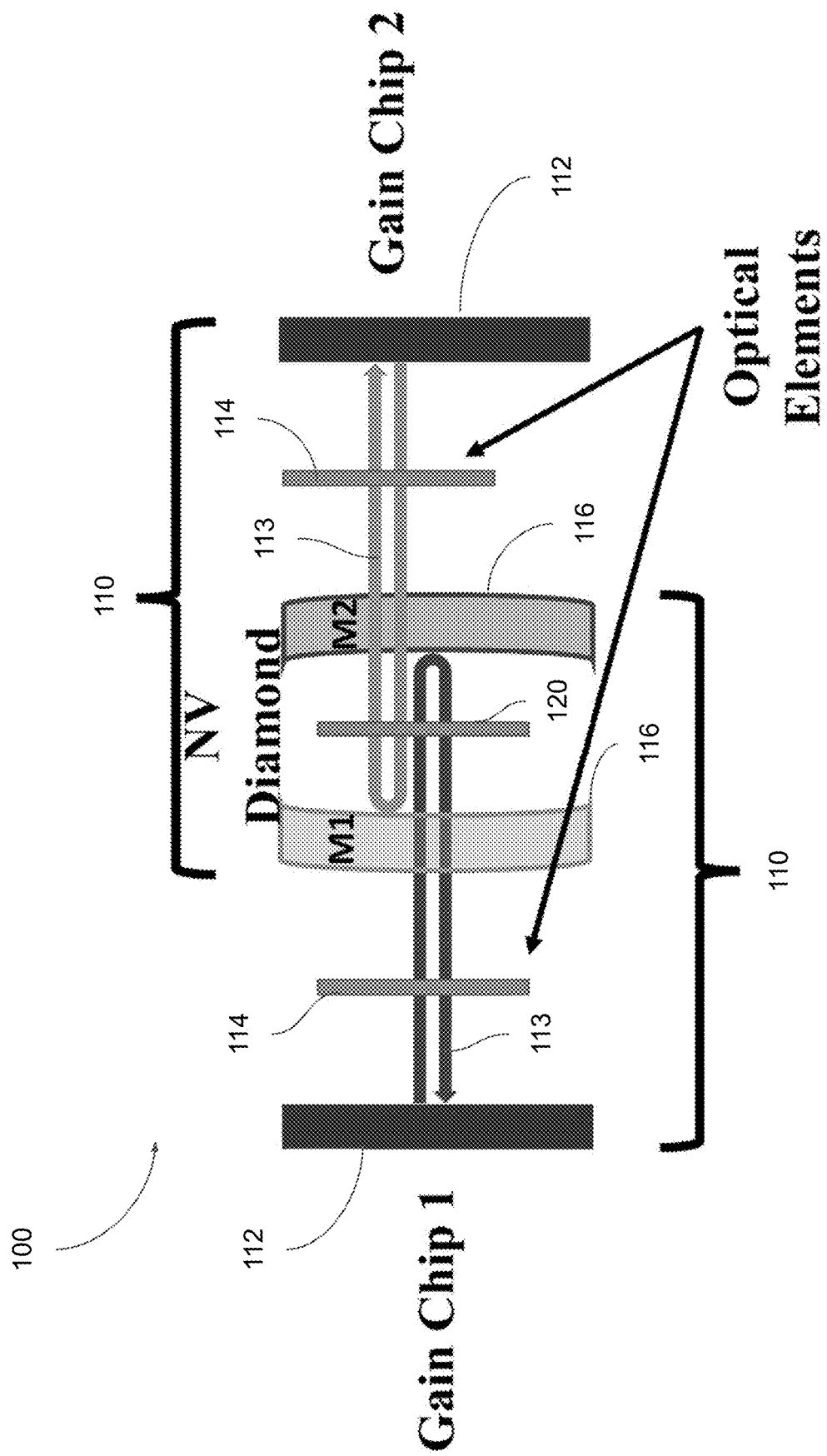
FIG. 2 shows the design of the NV diamond magnetometer of the present invention using two independent laser cavities.
Figure 3:
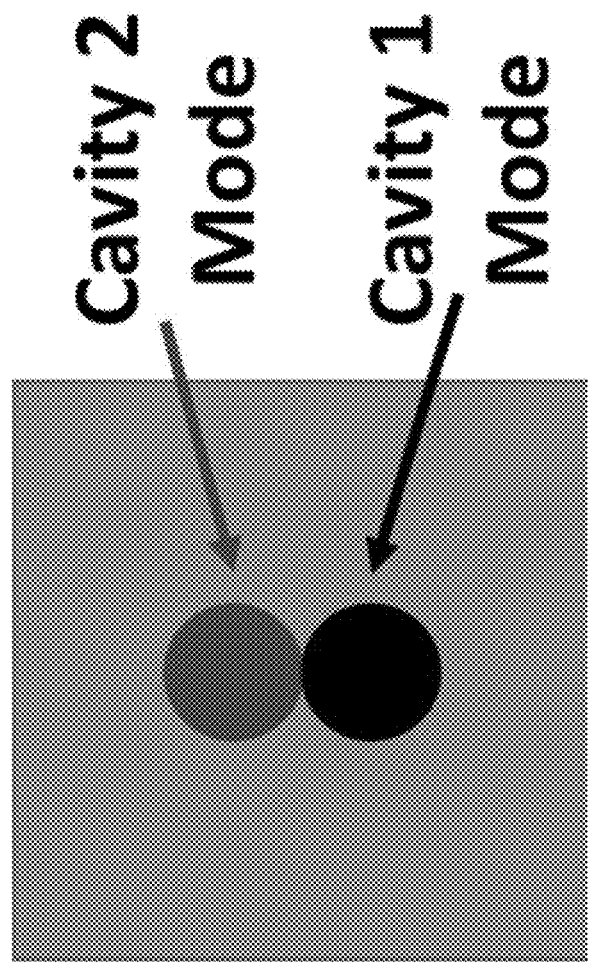
FIG. 3 shows the laser mode concept of the design of the present invention depicted in FIG. 2, showing two cavity modes that do not overlap in the NV diamond.

Following is a list of elements corresponding to a particular element referred to herein:
100 device
110 laser cavities
112 gain chip
113 laser beam
114 optical elements
116 mirror
120 NV diamond Referring now to FIGS. 2-3, the present invention features a magnetometer device (100) structured to measure a magnetic field while minimizing an effect of vibration on output. In some embodiments, the device (100) may comprise a laser cavity network containing a plurality of spatially-distinct cavity arms (110). In some embodiments, each cavity arm may comprise a gain chip (112) configured to generate a laser beam (113) towards one or more optical elements (114). Each cavity arm may further comprise the one or more optical elements (114) disposed optically in line with the laser beam (113), configured to direct the laser beam (113) towards a nitrogen-vacancy (NV) diamond (120). Each cavity may further comprise a mirror (116) disposed optically in line with the laser beam (113) directed towards the NV diamond (120), configured to be transparent to the laser beam (113) and reflective to laser beams generated by gain chips of other cavity arms of the plurality of cavity arms (110). The device (100) may further comprise the NV diamond (120) disposed within the laser cavity network, configured to accept a plurality of laser beams of the plurality of cavity arms (110) without a common output coupler measure the magnetic field in response to the plurality of laser beams. The optical elements (114) may be configured to direct the laser beams into the NV diamond without spatially overlapping.

In some embodiments, the one or more optical elements (114) of each cavity arm of the plurality of cavity arms (110) may be further configured to alter a wavelength, linewidth, transverse mode profile, beam size, beam position, or a combination thereof of each laser beam (113). In some embodiments, each mirror (116) of each cavity arm of the plurality of cavity arms (110) may be configured to direct each laser beam (113) back to each cavity arm. In some embodiments, the plurality of cavity arms (110) may be separated by reflective coatings, polarizing beam splitters, diffraction gratings, or a combination thereof.

In some embodiments, for at least one cavity arm of the plurality of cavity arms (110), the gain chip (112) may be disposed parallel to the NV diamond (120) and the one or more optical components are transparent such that the laser beam (113) is directed into the NV diamond (120) directly. In some embodiments, for at least one cavity arm of the plurality of cavity arms (110), the gain chip (112) is disposed anti-parallel to the NV diamond (120) and the one or more optical components are reflective and angled such that the laser beam (113) is reflected into the NV diamond (120). In some embodiments, the device (100) may be configured to be incorporated into a vehicle navigation system.

Figure 4:
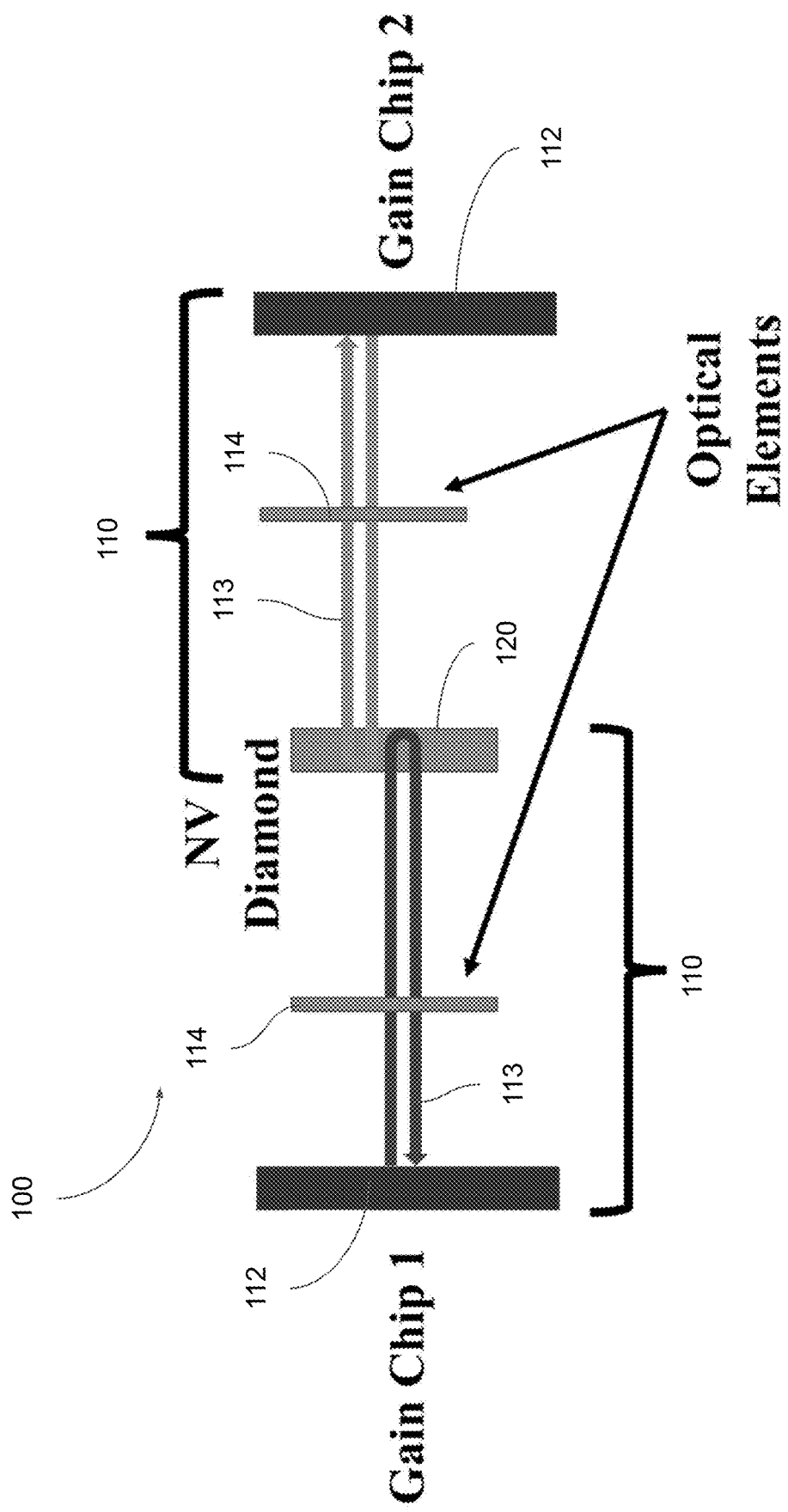
FIG. 4 shows an alternate design of the NV diamond magnetometer of the present invention where mirrors are removed and the surface of the diamond is appropriately coated for reflection of transmission of the laser modes.
Figure 5:
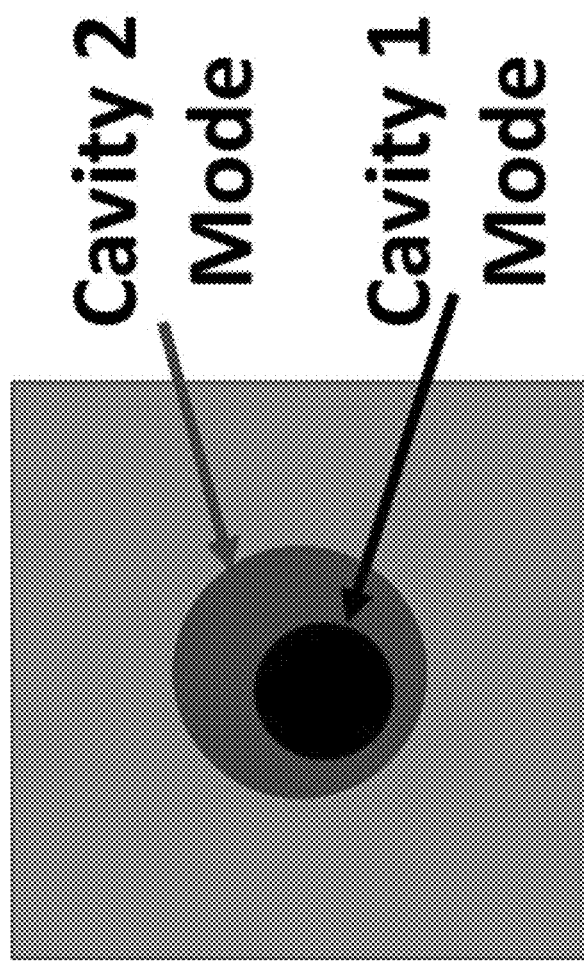
FIG. 5 shows the laser mode concept of the design of the present invention depicted in FIG. 4, showing that the mode size of a laser is increased independently of a second laser such that mechanical movement of the device still allows overlap of the two beams in the NV diamond.

Referring now to FIGS. 4-5, the present invention features a magnetometer device (100) structured to measure a magnetic field while minimizing an effect of vibration on output. In some embodiments, the device (100) may comprise a laser cavity network containing a plurality of spatially-distinct cavity arms (110). Each cavity arm may comprise a gain chip (112) configured to generate a laser beam (113) towards one or more optical elements (114). Each cavity arm may further comprise the one or more optical elements (114) disposed optically in line with the laser beam (113), configured to direct the laser beam (113) towards a NV diamond (120). Each laser beam (113) of a plurality of laser beams of the plurality of cavity arms (110) may comprise a different size. The device (100) may further comprise the NV diamond (120) disposed within the laser cavity network, configured to accept the plurality of laser beams of the plurality of cavity arms (110) without a common output coupler and measure the magnetic field in response to the plurality of laser beams. As a result of the differing sizes of the plurality of laser beams, the plurality of laser beams may spatially overlap without reacting to vibrations.

In some embodiments, the NV diamond (120) may be coated with a transparent material and a reflective material such that each laser beam (113) of the plurality of laser beams is configured to enter the NV diamond (120) and reflect back into each cavity arm. In some embodiments, the one or more optical elements (114) of each cavity arm of the plurality of cavity arms (110) may be further configured to alter a wavelength, linewidth, transverse mode profile, beam size, beam position, or a combination thereof of each laser beam (113). In some embodiments, the plurality of cavity arms (110) may be separated by reflective coatings, polarizing beam splitters, diffraction gratings, or a combination thereof.

In some embodiments, for at least one cavity arm of the plurality of cavity arms (110), the gain chip (112) may be disposed parallel to the NV diamond (120) and the one or more optical components are transparent such that the laser beam (113) is directed into the NV diamond (120) directly. In some embodiments, for at least one cavity arm of the plurality of cavity arms (110), the gain chip (112) is disposed anti-parallel to the NV diamond (120) and the one or more optical components are reflective and angled such that the laser beam (113) is reflected into the NV diamond (120). In some embodiments, the device (100) may be configured to be incorporated into a vehicle navigation system. In some embodiments, the plurality of lasers may be configured to partially overlap. In other embodiments, the plurality of lasers may be configured to fully overlap.

Referring specifically to FIG. 2, the overlapped cavities are used for a magnetometer that uses 2 lasers interacting in a NV diamond. In this figure, cavity 1 and cavity 2 are shown such that each laser mode (beam) does not overlap in the NV diamond. The interface at each optical element is chosen to be transparent, partially transparent, or reflective in order to create the desired optical path for each laser mode (beam). For instance, the element M1 in the figure would be transparent for laser mode from cavity one and highly reflective for the mode from laser cavity 2. Looking at the surface of the diamond the mode positions would be as shown in FIG. 3. In this figure, the individual laser modes from each cavity are the same size, but they do not spatially overlap.

Figure 1:
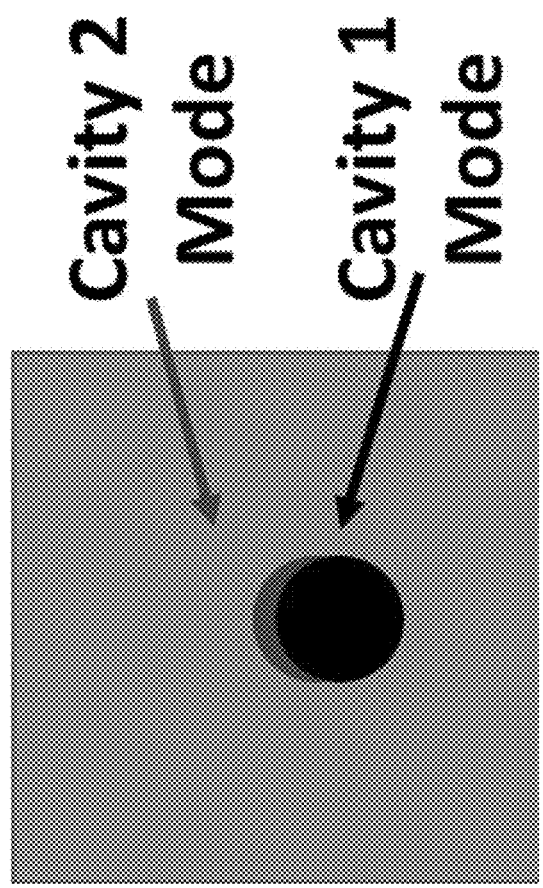
FIG. 1 shows a prior art laser overlap concept where two laser modes of the same size are made to partially (or exactly) overlap.

By adjusting the position of the laser cavities, the individual modes can be brought into close alignment with each other, as seen in FIG. 1. While this allows both laser modes to interact in the NV diamond, which is needed for the NV diamond magnetometer, this led to the device being very sensitive to mechanical vibrations. Since magnetometers tend to be used in vehicles like cars, airplanes, boats, etc. it is important they be insensitive to mechanical vibrations.

In order to help mitigate the vibration sensitivity, this design allows to not only include NV diamond in each cavity simultaneously, but it also allows for the independent control of the position as well as the spatial size of each lasing mode. As shown in FIG. 5, by choosing the optical cavity elements correctly, one lasing mode can be much larger than the other when interacting in the NV diamond.

Now when mechanical vibrations occur, the individual modes can shift position, but still maintain overlap in the NV diamond. It is also possible to alter this design to that shown in FIG. 4 In this design, the optical elements M1 and M2 are removed, and the surfaces of the NV diamond contain the desired transparent or reflective coatings. While this configuration looks like prior magnetometer designs, there is still no common output coupler between the two cavities since the surfaces of the diamond used to define each cavity are different.

Figure 6:
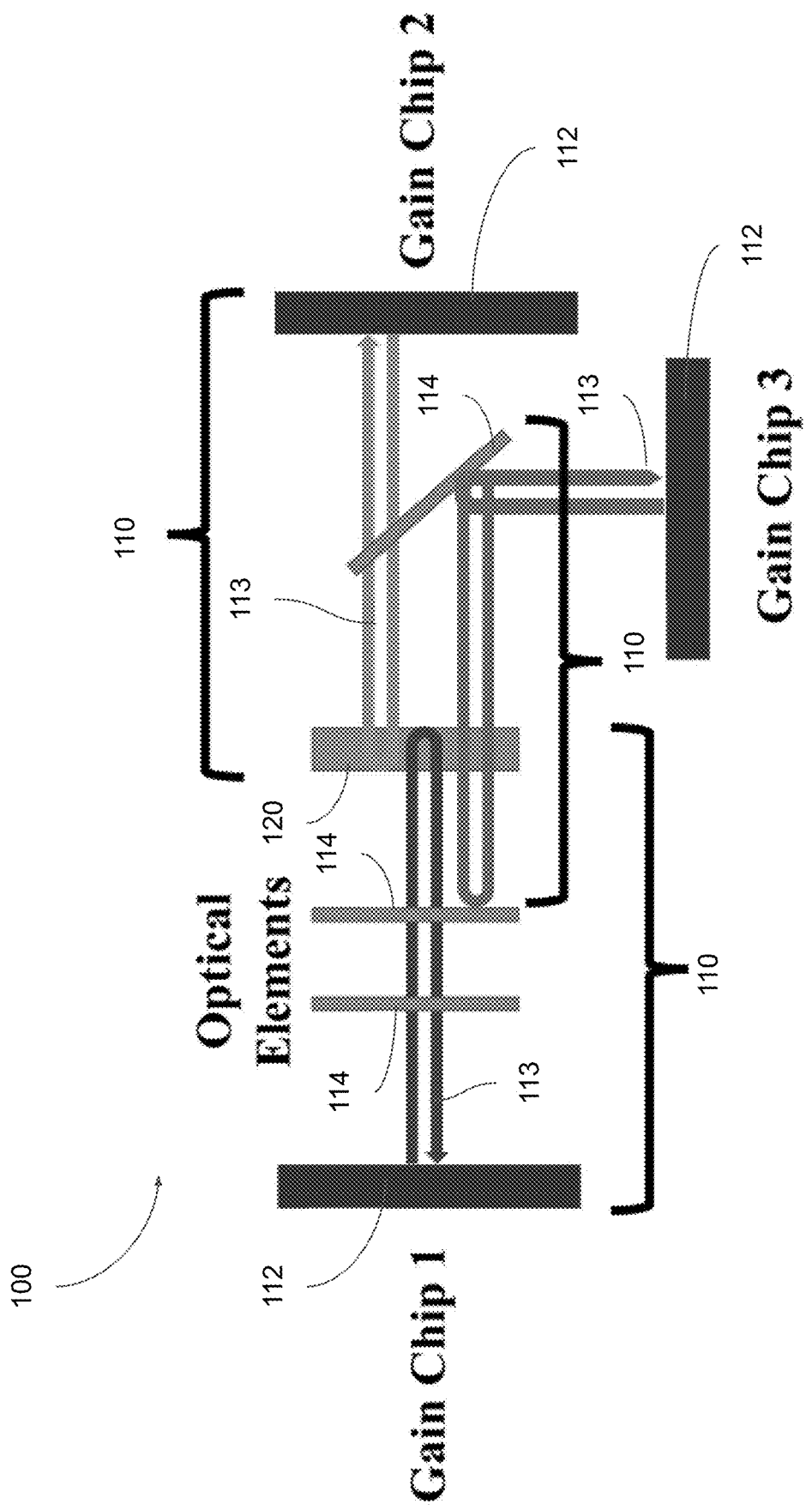
FIG. 6 shows an alternate design of the NV diamond magnetometer of the present invention having 3 or more overlapped cavities with independent mode control.

In addition to the current scheme for NV diamond magnetometry, it is anticipated other sensors, lasers, or applications could benefit from the design. Shown in FIG. 6 is a scheme to add additional laser cavities. In this case, 3 are shown, but other configurations are possible that would add even more laser cavities. It should be noted there are multiple ways to separate the beam paths and surfaces including but not limited to: reflective coatings, polarizing beam splitters, diffraction gratings, etc.

Also, the current configuration uses semiconductor quantum well material, the choice of laser gain media is irrelevant. As long as the gain media allows the beam path to be independently altered. As such there is no real limit on the wavelength (or color) of laser light used in the design.

In some embodiments, the optical elements may comprise lenses, filters, prisms, diffraction gratings, or a combination thereof. In some embodiments, the laser beams generated by the gain chips may all have the same wavelength, color, linewidth, etc., or the laser beams may differ in these properties.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting essentially of" or "consisting of", and as such the written description requirement for claiming one or more embodiments of the present invention using the phrase "consisting essentially of" or "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed is:

1. A magnetometer device (100) structured to measure a magnetic field while minimizing an effect of vibration on output, the device (100) comprising:
   a. a laser cavity network containing a plurality of spatially-distinct cavity arms (110), each cavity arm comprising:
      i. a gain chip (112) configured to generate a laser beam (113) towards one or more optical elements (114);
      ii. the one or more optical elements (114) disposed optically in line with the laser beam (113), configured to direct the laser beam (113) toward a nitrogen-vacancy (NV) diamond (120) such that the laser beam does not spatially overlap with laser beams generated by gain chips of other cavity arms of the plurality of cavity arms (110); and
      iii. a mirror (116) disposed optically in line with the laser beam (113) directed towards the NV diamond (120), configured to be transparent to the laser beam (113) and reflective to the laser beams generated by the gain chips of the other cavity arms of the plurality of cavity arms (110); and
   b. the NV diamond (120) disposed within the laser cavity network, configured to accept the laser beams of the plurality of cavity arms (110) without a common output coupler and measure the magnetic field in response to the plurality of laser beams.

2. The device (100) of claim 1, wherein the one or more optical elements (114) of each cavity arm are further configured to alter a wavelength, linewidth, transverse mode profile, beam size, beam position, or a combination thereof of each laser beam (113).

3. The device (100) of claim 1, wherein each mirror (116) of each cavity arm of the plurality of cavity arms (110) is configured to direct each laser beam (113) back to each cavity arm.

4. The device (100) of claim 1, wherein the plurality of cavity arms (110) are separated by reflective coatings, polarizing beam splitters, diffraction gratings, or a combination thereof.

5. The device (100) of claim 1, wherein for at least one cavity arm of the plurality of cavity arms (110), the gain chip (112) is disposed parallel to the NV diamond (120) and the one or more optical components are transparent such that the laser beam (113) is directed into the NV diamond (120) directly.

6. The device (100) of claim 1, wherein for at least one cavity arm of the plurality of cavity arms (110), the gain chip (112) is disposed anti-parallel to the NV diamond (120) and the one or more optical components are reflective and angled such that the laser beam (113) is reflected into the NV diamond (120).

7. The device (100) of claim 1, wherein the device (100) is configured to be incorporated into a vehicle navigation system.

8. A magnetometer device (100) structured to measure a magnetic field while minimizing an effect of vibration on output, the device (100) comprising:
   a. a laser cavity network containing a plurality of spatially-distinct cavity arms (110), each cavity arm comprising:
      i. a gain chip (112) configured to generate a laser beam (113) towards one or more optical elements (114); and
      ii. the one or more optical elements (114) disposed optically in line with the laser beam (113), configured to direct the laser beam (113) toward a nitrogen-vacancy (NV) diamond (120); and
      wherein each laser beam (113) of a plurality of laser beams of the plurality of cavity arms (110) comprises a different size;
   b. the NV diamond (120) disposed within the laser cavity network, configured to accept the plurality of laser beams of the plurality of cavity arms (110) without a common output coupler and measure the magnetic field in response to the plurality of laser beams, wherein the plurality of laser beams spatially overlap without reacting to vibrations.

9. The device (100) of claim 8, wherein the NV diamond (120) is coated with a transparent material and a reflective material such that each laser beam (113) of the plurality of laser beams is configured to enter the NV diamond (120) and reflect back into each cavity arm.

10. The device (100) of claim 8, wherein the one or more optical elements (114) of each cavity arm of the plurality of cavity arms (110) are further configured to alter a wavelength, linewidth, transverse mode profile, beam size, beam position, or a combination thereof of each laser beam (113).

11. The device (100) of claim 8, wherein the plurality of cavity arms (110) are separated by reflective coatings, polarizing beam splitters, diffraction gratings, or a combination thereof.

12. The device (100) of claim 8, wherein for at least one cavity arm of the plurality of cavity arms (110), the gain chip (112) is disposed parallel to the NV diamond (120) and the one or more optical components are transparent such that the laser beam (113) is directed into the NV diamond (120) directly.

13. The device (100) of claim 8, wherein for at least one cavity arm of the plurality of cavity arms (110), the gain chip (112) is disposed anti-parallel to the NV diamond (120) and the one or more optical components are reflective and angled such that the laser beam (113) is reflected into the NV diamond (120).

14. The device (100) of claim 8, wherein the device (100) is configured to be incorporated into a vehicle navigation system.

15. The device (100) of claim 1, wherein the plurality of lasers are configured to partially overlap.

16. The device (100) of claim 1, wherein the plurality of lasers are configured to fully overlap.

* * * * *